(12) United States Patent
Goeke

(10) Patent No.: US 12,531,566 B2
(45) Date of Patent: Jan. 20, 2026

(54) COMBINING SAMPLING ANALOG-TO-DIGITAL CONVERTER WITH CONTINUOUSLY INTEGRATING ANALOG-TO-DIGITAL CONVERTER

(71) Applicant: Keithley Instruments, LLC, Solon, OH (US)

(72) Inventor: Wayne C. Goeke, Hudson, OH (US)

(73) Assignee: Keithley Instruments, LLC, Solon, OH (US)

( * ) Notice: Subject to any disclaimer, the term of this patent is extended or adjusted under 35 U.S.C. 154(b) by 168 days.

(21) Appl. No.: 18/125,668

(22) Filed: Mar. 23, 2023

(65) Prior Publication Data

US 2023/0308106 A1 Sep. 28, 2023

Related U.S. Application Data

(60) Provisional application No. 63/324,417, filed on Mar. 28, 2022.

(51) Int. Cl.
*H03M 1/06* (2006.01)
*H03M 1/12* (2006.01)

(52) U.S. Cl.
CPC ....... *H03M 1/0609* (2013.01); *H03M 1/0626* (2013.01); *H03M 1/126* (2013.01)

(58) Field of Classification Search
CPC .... H03M 1/1215; H03M 1/12; H03M 1/1009; H03M 1/0626; H03M 1/0678; H03M 1/1038; H03M 1/1245; H03M 1/0836; H03M 1/1042; H03M 1/0609; H03M 1/0624; H03M 3/458; H03M 1/1023; H03M 1/1033; H03M 1/38; H03M 1/44; H03M 1/46; H03M 1/002; H03M 1/0617; H03M 1/0658; H03M 1/1004; H03M 1/1014; H03M 1/1085; H03M 1/121; H03M 1/123; H03M 1/126; H03M 1/188; H03M 1/34; H03M 1/66; H03M 3/344; H03M 3/46; H03M 3/464; H03M 1/00; H03M 1/004;
(Continued)

(56) References Cited

U.S. PATENT DOCUMENTS 9,154,146 B1 * 10/2015 Chiu .................... H03M 1/1042
9,419,642 B1 * 8/2016 Nguyen .................. H03M 3/42
(Continued)

*Primary Examiner* — Linh V Nguyen
(74) *Attorney, Agent, or Firm* — Miller Nash LLP; Andrew J. Harrington; Krista Y. Chan

(57) ABSTRACT

A digitizing circuit includes a port connectable to a device under test (DUT), an integrating analog-to-digital converter (ADC), a high-speed ADC, one or more processors to apply a digital filter to output samples of the high-speed ADC to produce filtered samples, find differences between the filtered samples and samples from the integrating ADC to produce error values, and add the error values to the output samples of the high-speed ADC. A method of producing a digital signal includes receiving an input analog signal at an integrating analog-to-digital converter (ADC) and a high-speed ADC, applying a digital filter to output samples of the high-speed ADC to produce filtered samples, the digital filter matched to timing and filtering of the integrating ADC, finding differences between the filtered samples to output samples of the integrating ADC to produce error values, and adding the error values to the output samples of the high-speed ADC.

20 Claims, 3 Drawing Sheets

(58) Field of Classification Search
CPC ...... H03M 1/005; H03M 1/06; H03M 1/0602; H03M 1/0604; H03M 1/0612; H03M 1/0614; H03M 1/0639; H03M 1/069; H03M 1/0854; H03M 1/0863
USPC ................. 341/118, 119, 120, 121, 140, 141
See application file for complete search history.

(56) References Cited

U.S. PATENT DOCUMENTS

| | | | | |
|---|---|---|---|---|
| 9,461,661 | B1* | 10/2016 | Kull | H03M 1/0678 |
| 9,859,907 | B1* | 1/2018 | Li | H03M 1/0678 |
| 10,784,881 | B1* | 9/2020 | Shaddock | G01R 31/31917 |
| 11,552,646 | B2* | 1/2023 | Bal | H03M 1/0624 |
| 2011/0267211 | A1* | 11/2011 | Oshima | H03M 1/1038 |
| | | | | 341/118 |
| 2013/0027233 | A1* | 1/2013 | Nozaki | H03M 1/12 |
| | | | | 341/118 |
| 2015/0180495 | A1* | 6/2015 | Klippel | H03M 1/1038 |
| | | | | 341/118 |
| 2018/0026816 | A1* | 1/2018 | Pickerd | H04L 25/03828 |
| | | | | 375/232 |
| 2021/0194491 | A1* | 6/2021 | Sjöland | H03M 1/1023 |
| 2022/0131549 | A1* | 4/2022 | Huang | H03M 1/1061 |
| 2023/0361779 | A1* | 11/2023 | Wang | H03M 1/1009 |

* cited by examiner

COMBINING SAMPLING ANALOG-TO-DIGITAL CONVERTER WITH CONTINUOUSLY INTEGRATING ANALOG-TO-DIGITAL CONVERTER

CROSS-REFERENCE TO RELATED APPLICATIONS

This disclosure claims benefit of U.S. Provisional Application No. 63/324,417, titled "COMBINING SAMPLING ANALOG-TO-DIGITAL CONVERTER WITH CONTINUOUSLY INTEGRATING ANALOG-TO-DIGITAL CONVERTER," filed on Mar. 28, 2022, the disclosure of which is incorporated herein by reference in its entirety.

TECHNICAL FIELD

This disclosure relates to test and measurement systems and instruments, and more particularly to a digitizer circuit for a test and measurement system.

BACKGROUND

An analog-to-digital converter (ADC) is used in a test and measurement system or a test and measurement instrument such as an oscilloscope, digital multimeter, source measure unit (SMU) and the like, to convert a continuous analog input signal to a stream of digital samples. Two key factors in the performance of ADCs are speed, i.e. sample rate, and resolution.

Some ADCs operate at high speeds, but have low resolution, usually expressed as a number of bits. For example, a 10-bit resolution ADC has lower resolution than a 12-bit ADC. Different methods exist for performing the conversion, some methods work at a faster rate, other methods have a higher resolution. It is difficult for current ADCs to achieve both high speed and high resolution.

DETAILED DESCRIPTION

The embodiments here use two analog-to-digital converters (ADC), one a high-speed sampling ADC and one a continuously integrating ADC. The process of combining the difference between their outputs with the outputs of the high-speed ADC provides the output samples. This allows the process to have the linearity, noise, resolution, and non-aliasing performance of the continuously integrating ADC, while having the higher speed performance of the ADC.

Figure 1:
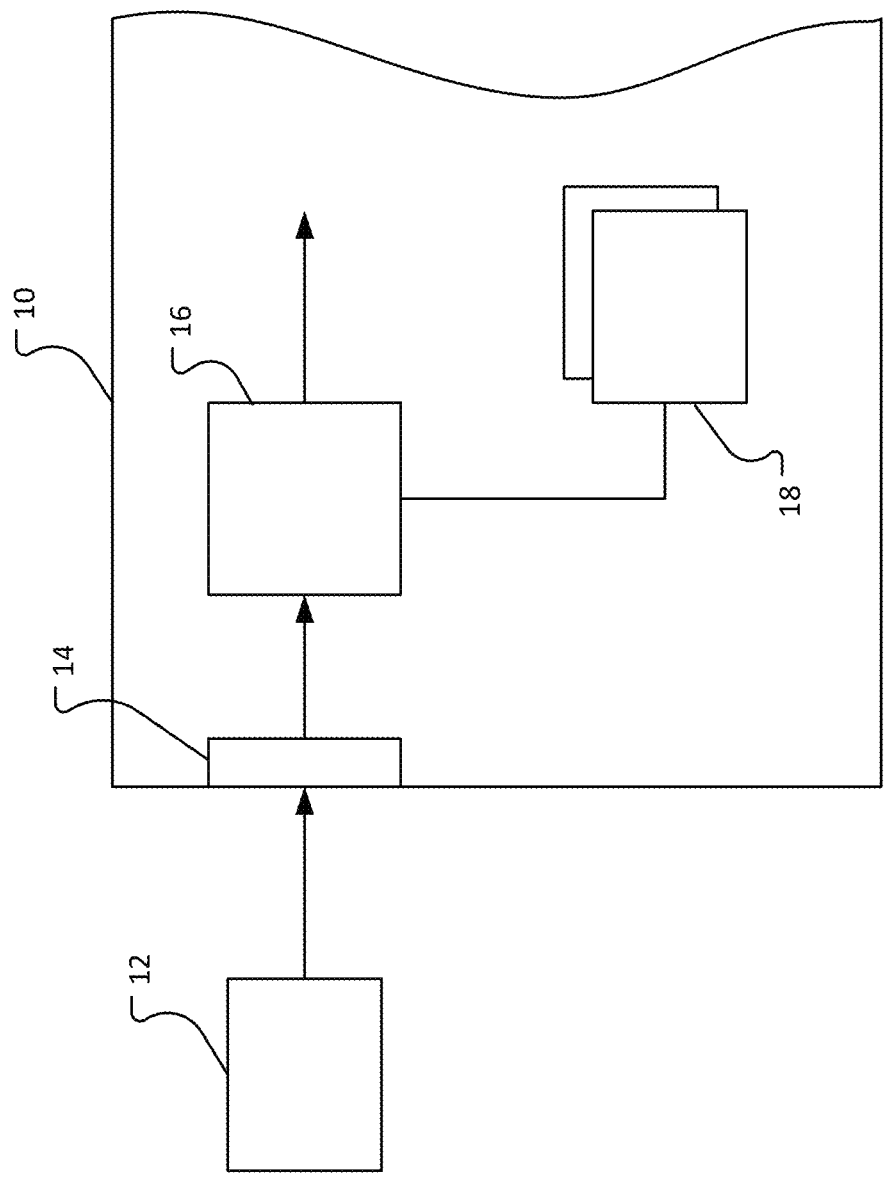
FIG. 1 shows a test and measurement instrument having a digitizer circuit.

Many different types of test and measurement instruments such as oscilloscopes, source measure units (SMU), analyzers, multimeters, etc., may receive an analog signal, such as from a device under test (DUT) and convert it to a digital signal for various purposes. FIG. 1 shows a block diagram of a portion of such an instrument.

A DUT 12 connects to the test and measurement instrument 10 through a probe, cable, or other connector to allow the instrument to receive signals from the DUT through port 14. The instrument receives the signal and digitizes it with one or more ADCs in the digitizing circuit 16 and has one or more processors such as 18 that process the signal for filtering, the adding of the two signals, matching the ADCs gains, etc., that will be discussed in more detail further. The term "processor" as used herein means any type of component that can operate on a signal, including, but not limited to general-purpose processors, digital signal processors, Application Specific Integrated Circuits (ASICs), field-programmable gate arrays (FPGAs), etc. If the processor is a general-purpose or digital signal processor, they may implement the embodiments in the form of executable code that they execute. Other components may not execute code but have hardware components configured to cause them to implement the process of the embodiments. There may be more than one processor.

Figure 2:
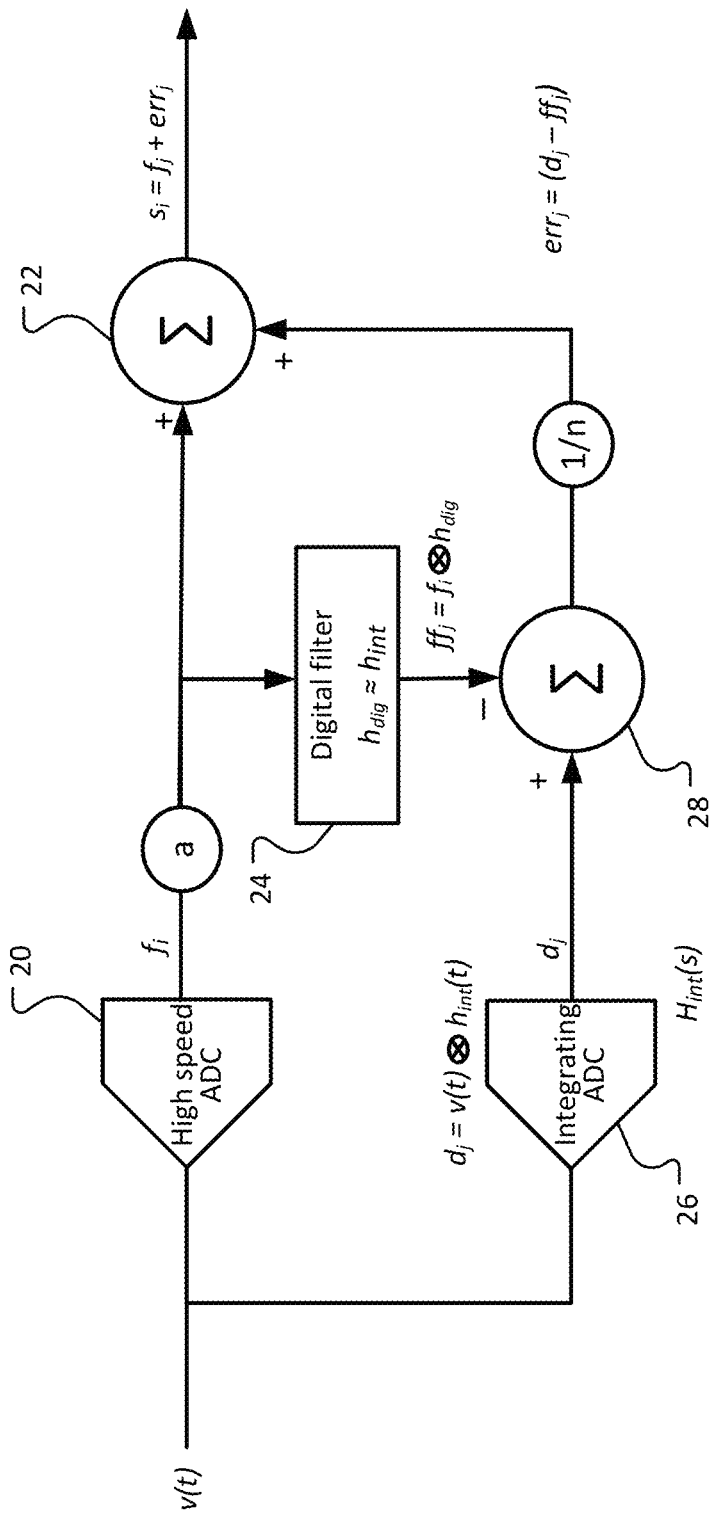
FIG. 2 shows an embodiment of a digitizer circuit.

FIG. 2 shows a block diagram of a digitizer circuit or sampling system that combines a high-speed sampling ADC with an integrating ADC, according to embodiments of the disclosure. A continuously integrating ADC and a pseudo-continuously integrating ADC, such as a sampling delta-sigma ADC, have time apertures that are determined by clocks, logic and/or digital filters. As used herein, the term "integrating" ADC will apply to both continuously integrated ADCs and pseudo-continuously integrating ADCs, such as sampling delta sigma ADCs.

Figure 3:
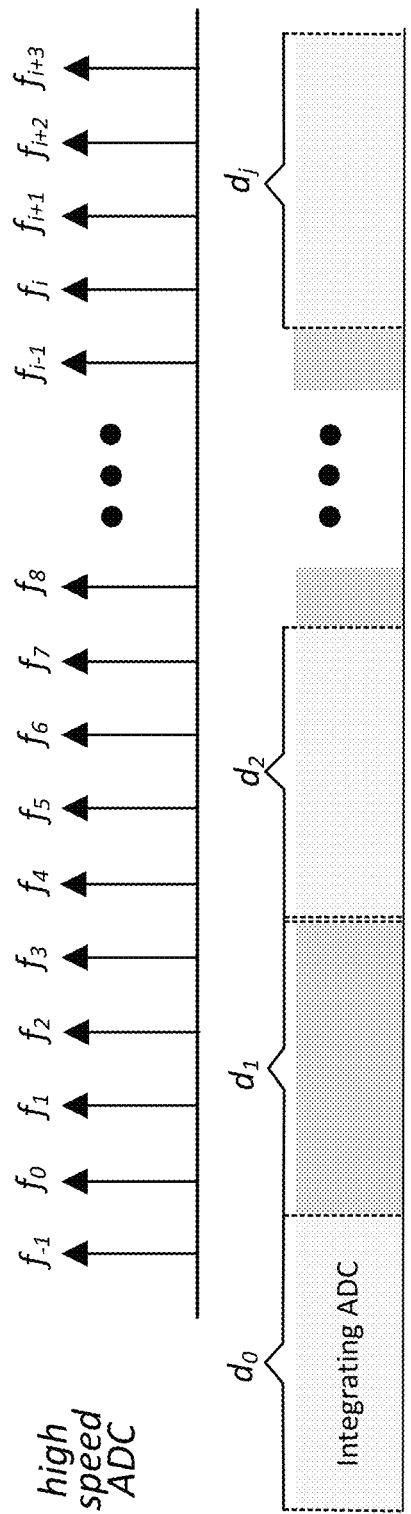
FIG. 3 shows a graphical representation of sample correlation between two ADCs.

In FIG. 2, the high-speed ADC 20 and the integrating ADC 26 receive the incoming analog signal v(t). The high-speed ADC produces samples such as fi that goes to both the digital filter 24, and the summing node 22. As will be discussed further, if the offsets and gains between the two ADCs need to be adjusted, a factor a allows for that adjustment. The integrating ADC has a filter $h_{int}$ that matches the digital filter 24 $h_{dig}$ and produces a sample dj. For each sample from the high-speed ADC 20, after filtering producing a filtered sample, the node 28 compares the dj sample to each of the filtered high-speed samples $ff_j$, $err_j = (d_j - ff_j/n)$. There is a sampling difference between the integrating ADC and the high-speed ADC, so the high-speed ADC produces some number of samples, n, during the integration interval of the integrating ADC so each error value is 1/n. As shown in FIG. 3, n=4, as an example for ease of discussion. For each dj, then, in FIG. 2, there are four samples from the high-speed ADC, as shown in FIG. 3.

In FIG. 3, the high-speed ADC has samples such as $f_{-1}$. The integrating ADC produces the sample d(0) during the period of time when the high-speed ADC produces samples $f_{-4}$, $f_{-3}$, $f_{-2}$, and $f_{-1}$. The high-speed ADC produces the next four high-speed ADC samples, 0-3, during the integration period of the integration ADC for sample d(1). Sample s(i) results from the equation:

$$s_i = f_i + d_j - \left(\frac{1}{n}\right)\sum_{k=n\cdot j-n}^{n(j+1)-1-n} f_k,$$

$$j = trunc\left(\frac{i}{n}\right).$$

Following from that, for the example when n=4:

$s_0 = f_0 + d_0 - (f_{-4} + f_{-3} + f_{-2} + f_{-1})/4$ $s_1 = f_1 + d_0 - (f_{-4} + f_{-3} + f_{-2} + f_{-1})/4$ $s_2 = f_2 + d_0 - (f_{-4} + f_{-3} + f_{-2} + f_{-1})/4$ $s_3 = f_3 + d_0 - (f_{-4} + f_{-3} + f_{-2} + f_{-1})/4$ $s_4 = f_4 + d_1 - (f_0 + f_1 + f_2 + f_3)/4$ $s_5 = f_5 + d_1 - (f_0 + f_1 + f_2 + f_3)/4$ $s_6 = f_6 + d_1 - (f_0 + f_1 + f_2 + f_3)/4$ $s_7 = f_7 + d_1 - (f_0 + f_1 + f_2 + f_3)/4$ $s_8 = f_8 + d_2 - (f_4 + f_5 + f_6 + f_7)/4.$

This particular example shows an example of an integration window for the integrating ADC formed of contiguous blocks of the filtered samples. The system could also use a sliding window of samples. Using an average of the m samples removes the high speed ADC from the result, according to the equation:

$$ss_j = \frac{1}{n} \sum_{k=j}^{j+n-1} s_k$$

For example, $s_1$ includes $f_1$ while $s_4$ through $s_7$ include $-f_1/4$ each. Any average that includes $s_1$ through $s_7$ mathematically removes $f_1$.

The high-speed ADC has a filter matched to the timing and filtering of the integrating ADC. The process updates this filter output at the same rate as the integrating ADC samples. Integrating ADCs have time apertures determined by clocks, logic, and/or digital filters. This allows a design of a digital filter to be applied to the output of the high-speed sampling to match the aperture of the integrating ADC perfectly. By applying such a digital filter to the output of the high-speed sampling ADC, the output of the digital filter can match the aperture of the integrating ADC to within the differences of the two ADCs' error terms such as noise, linearity, distortion, etc. As the slower integrating ADC produces a new output, the digital filter applied to the high-speed ADC can be updated to match it.

The result is a high-speed sampling system in which the high-speed ADC's performance dominates at higher frequencies and the integrating ADC dominates at lower frequencies. The transition between the two ADCs is nearly perfectly flat versus frequency. The transition errors are determined by how well the digital filter matches the continuously integrating ADC's aperture as well as any difference of the ADC's gains.

One issue may arise because of a mismatch between the gains and offsets of the ADCs. A two-step process can match the ADCs. First, if the input, v(t), is set to zero and the offset of one or both ADC(s) is(are) adjusted until the error, $err_j$, is approximately zero. Second, a large scale signal of zero or lower frequency is input and the gain of one or both ADC(s) is(are) adjusted until the error, $err_i = (d_j - ff_j)/n$, is approximately zero. The signal can have an amplitude of less than full scale.

In this manner, a system can combine the readings from a high-speed sampling ADC with the slower readings of a continuously integrating ADC producing the high-speed reading rate of the sampling ADC and has the lower frequency advantages of the continuously integrating ADC.

Shaping the digital filter to match the timing and bandwidth characteristic of the continuously integrating ADC yields a frequency flat transition between the two ADCs. This allows the combined sampling system to provide the high-speed sampling needed for high frequency signals, but maintain the performance, linearity, noise, resolution, and non-aliasing of the continuously integrating ADC for lower frequencies.

Aspects of the disclosure may operate on particularly created hardware, on firmware, digital signal processors, or on a specially programmed general-purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable, or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Also, when reference is made in this application to a method having two or more defined steps or operations, the defined steps or operations can be carried out in any order or simultaneously, unless the context excludes those possibilities.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

EXAMPLES

Illustrative examples of the disclosed technologies are provided below. An embodiment of the technologies may include one or more, and any combination of, the examples described below.

Example 1 is a digitizing circuit, comprising: a port connectable to a device under test (DUT) to receive an input analog signal; an integrating analog-to-digital converter (ADC) coupled to the port to receive the analog signal; a high-speed ADC coupled to the port to receive the analog signal, the high-speed ADC having a higher speed than the integrating ADC; and one or more processors configured to: apply a digital filter to output samples of the high-speed ADC to produce filtered samples; find differences between the filtered samples and output samples of the integrating ADC to produce error values; and add the error values to the output samples of the high-speed ADC to produce data samples of the analog signal.

Example 2 is the digitizing circuit of Example 1, wherein the one or more processors are further configured to update the digital filter after each output sample of the integrating ADC.

Example 3 is the digitizing circuit of either of Examples 1 or 2, wherein the one or more processors configured to find differences between the filtered samples and the output samples of the integrating ADC are further configured to: subtract a filtered sample from an output sample of the integrating ADC to produce a difference; and multiply the difference by a ratio of a sample rate of the integrating ADC to a sample rate of the high-speed ADC.

Example 4 is the digitizing circuit of any of Examples 1 through 3, wherein the integrating ADC has an integration interval equal to a integer number of high-speed time positions of the high-speed ADC, and the integration window applies to contiguous blocks of sampling time positions.

Example 5 is the digitizing circuit of any of Examples 1 through 3, wherein the integrating ADC has an integration interval equal to a number of sampling time positions of the high-speed ADC, and the integration window is a sliding window across the sampling time positions.

Example 6 is the digitizing circuit of any of Examples 1 through 5, wherein the one or more processors are further configured to match offsets of the integrating ADC and the high-speed ADC.

Example 7 is the digitizing circuit of any of Examples 1 through 6, wherein the one or more processors are further configured to match gains of the integrating ADC and the high-speed ADC.

Example 8 is a method of producing a digital signal from an analog signal, comprising: receiving an input analog signal at an integrating analog-to-digital converter (ADC) and a high-speed ADC having a higher speed than the integrating ADC; applying a digital filter to output samples of the high-speed ADC to produce filtered samples, the digital filter being matched to timing and filtering of the integrating ADC; finding differences between the filtered samples and output samples of the integrating ADC to produce error values; and adding the error values to the output samples of the high-speed ADC to produce data samples of the analog signal.

Example 9 is the method of Example 8, further comprising updating the digital filter as necessary after each output sample of the integrating ADC.

Example 10 is the method of either Examples 8 or 9, wherein finding differences between the filtered samples and output samples of the integrating ADC comprises: subtracting a filtered sample from an output sample of the integrated ADC; and multiplying the difference by a ratio of a sample rate of the integrating ADC to a sample rate of the high-speed ADC.

Example 11 is the method of any of Examples 8 through 10, wherein the integrating ADC has an integration interval equal to a number of sampling time positions of the high-speed ADC, and the integration window applies to contiguous blocks of sampling time positions.

Example 12 is the method of any of Examples 8 through 11, wherein the integrated ADC has an integration interval equal to a number of sampling time positions of the high-speed ADC, and the integration window is a sliding window across the sampling time positions.

Example 13 is the method of any of Examples 8 through 12, further comprising matching offsets of the integrating ADC and the high-speed ADC.

Example 14 is the method of Example 13, wherein matching offsets comprises setting a value of the input analog signal to zero and adjusting an offset of at least one of the integrating ADC and the high-speed ADC until the error value is zero.

Example 15 is the method of any of Examples 8 through 12, further comprising matching gains of the integrating ADC and the high-speed ADC.

Example 16 is the method Example 15, wherein matching gains comprises setting the input analog signal with enough amplitude sufficient to adjust the gain, and adjusting the gain of at least one of the integrating ADC and the high-speed ADC until the error is zero.

The previously described versions of the disclosed subject matter have many advantages that were either described or would be apparent to a person of ordinary skill. Even so, these advantages or features are not required in all versions of the disclosed apparatus, systems, or methods.

Although specific aspects of the disclosure have been illustrated and described for purposes of illustration, it will be understood that various modifications may be made without departing from the spirit and scope of the disclosure. Accordingly, the disclosure should not be limited except as by the appended claims.

I claim:

1. A digitizing circuit, comprising:
a port connectable to a device under test (DUT) to receive an input analog signal;
an integrating analog-to-digital converter (ADC) coupled to the port to receive the input analog signal, wherein the integrating ADC comprises a digital filter;
a high-speed ADC coupled to the port to receive the input analog signal, the high-speed ADC having a higher speed than the integrating ADC; and
one or more processors configured to:
apply a digital filter to output samples of the high-speed ADC to produce filtered samples, wherein the digital filter approximately matches an aperture of the integrating ADC determined by the digital filter of the integrating ADC;

find differences between the filtered samples and output samples of the integrating ADC to produce error values based on a ratio of a sample rate of the integrating ADC to a sample rate of the high-speed ADC; and add the error values to the output samples of the high-speed ADC to produce data samples of the input analog signal.

2. The digitizing circuit as claimed in claim 1, wherein the one or more processors are further configured to update the digital filter after each output sample of the integrating ADC.

3. The digitizing circuit as claimed in claim 1, wherein the one or more processors configured to find differences between the filtered samples and the output samples of the integrating ADC are further configured to:

subtract a filtered sample from an output sample of the integrating ADC to produce a difference; and multiply the difference by the ratio of the sample rate of the integrating ADC to the sample rate of the high-speed ADC.

4. The digitizing circuit as claimed in claim 1, wherein the integrating ADC has an integration interval equal to an integer number of high-speed time positions of the high-speed ADC, and the integration interval applies to contiguous blocks of sampling time positions.

5. The digitizing circuit as claimed in claim 1, wherein the integrating ADC has an integration interval equal to a number of sampling time positions of the high-speed ADC, and the integration interval is a sliding window across the sampling time positions.

6. The digitizing circuit as claimed in claim 1, wherein the one or more processors are further configured to match offsets of the integrating ADC and the high-speed ADC.

7. The digitizing circuit as claimed in claim 1, wherein the one or more processors are further configured to match gains of the integrating ADC and the high-speed ADC.

8. A method of producing a digital signal from an analog signal, comprising:

receiving an input analog signal at an integrating analog-to-digital converter (ADC) and a high-speed ADC having a higher speed than the integrating ADC, wherein the integrating ADC comprises a digital filter;

applying a digital filter to output samples of the high-speed ADC to produce filtered samples, the digital filter being matched to an aperture of the integrating ADC determined by the digital filter of the integrating ADC;

finding differences between the filtered samples and output samples of the integrating ADC to produce error values based on a ratio of a sample rate of the integrating ADC to a sample rate of the high-speed ADC; and adding the error values to the output samples of the high-speed ADC to produce data samples of the input analog signal.

9. The method as claimed in claim 8, further comprising updating the digital filter as necessary after each output sample of the integrating ADC.

10. The method as claimed in claim 8, wherein finding differences between the filtered samples and output samples of the integrating ADC comprises:

subtracting a filtered sample from an output sample of the integrated ADC; and multiplying the difference by the ratio of the sample rate of the integrating ADC to the sample rate of the high-speed ADC.

11. The method as claimed in claim 8, wherein the integrating ADC has an integration interval equal to a number of sampling time positions of the high-speed ADC, and the integration interval applies to contiguous blocks of sampling time positions.

12. The method as claimed in claim 8, wherein the integrated ADC has an integration interval equal to a number of sampling time positions of the high-speed ADC, and the integration interval is a sliding window across the sampling time positions.

13. The method as claimed in claim 8, further comprising matching offsets of the integrating ADC and the high-speed ADC.

14. The method as claimed in claim 13, wherein matching offsets comprises setting a value of the input analog signal to zero and adjusting an offset of at least one of the integrating ADC and the high-speed ADC until the error values are zero.

15. The method as claimed in claim 8, further comprising matching gains of the integrating ADC and the high-speed ADC.

16. The method as claimed in claim 15, wherein matching gains comprises setting the input analog signal with enough amplitude sufficient to adjust the gain, and adjusting the gain of at least one of the integrating ADC and the high-speed ADC until the error values are zero.

17. A circuit, comprising:

a port connectable to a device under test (DUT) to receive an input signal;

a first analog-to-digital converter (ADC) coupled to the port to receive the input signal;

a second ADC coupled to the port to receive the input signal, the second ADC having a higher speed than the first ADC; and one or more processors configured to:

apply a digital filter to output samples of the second ADC to produce filtered samples, the digital filter being matched to an aperture of the first ADC determined by a digital filter of the first ADC;

subtract the filtered samples from output samples of the first ADC to produce differences;

multiply the differences by a ratio of a sample rate of the first ADC to a sample rate of the second ADC to produce error values; and add the error values to the output samples of the second ADC to produce data samples of the input signal.

18. The circuit as claimed in claim 17, wherein the first ADC has an integration interval equal to one of an integer number of high-speed time positions or a number of sampling time positions of the second ADC, and the integration interval applies to one of contiguous blocks of sampling time positions or a sliding window across the sampling time positions.

19. The circuit as claimed in claim 17, wherein the one or more processors are further configured to match at least one of gains or offsets of the first ADC and the second ADC.

20. A method, comprising:

receiving an input analog signal at a first analog-to-digital converter (ADC) and a second ADC having a higher sample rate than the first ADC, wherein the first ADC comprises a digital filter;

applying a digital filter to output samples of the second ADC to produce filtered samples, the digital filter being matched to an aperture of the first ADC determined by the digital filter of the first ADC;

finding differences between the filtered samples and output samples of the first ADC to produce error values based on a ratio of a sample rate of the first ADC to a sample rate of the second ADC; and adding the error values to the output samples of the second ADC to produce data samples of the input analog signal.

\* \* \* \* \*